United States Patent
Lee (10) Patent No.: US 7,554,847 B2
(45) Date of Patent: Jun. 30, 2009

(54) FLASH MEMORY DEVICE EMPLOYING DISTURBANCE MONITORING SCHEME

(75) Inventor: Jong-Soo Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 140 days.

(21) Appl. No.: 11/730,291

(22) Filed: Mar. 30, 2007

(65) Prior Publication Data
US 2008/0049507 A1 Feb. 28, 2008

(30) Foreign Application Priority Data
Aug. 28, 2006 (KR) ................. 10-2006-0081745

(51) Int. Cl.
*G11C 11/34* (2006.01)

(52) U.S. Cl. .................... 365/185.18; 365/185.11; 365/189.05; 365/185.28; 365/185.23; 365/230.08

(58) Field of Classification Search ........... 365/185.17, 365/200, 201, 185.28, 185.11, 185.18, 189.05, 365/185.23, 230.08, 238.5
See application file for complete search history.

(56) References Cited

U.S. PATENT DOCUMENTS

| 6,031,759 A | 2/2000 | Ohashi | |
| 6,046,936 A * | 4/2000 | Tsujikawa et al. | 365/185.03 |
| 6,490,198 B2 * | 12/2002 | Yoshimura | 365/185.09 |
| 6,661,707 B2 * | 12/2003 | Choi et al. | 365/185.17 |
| 6,853,598 B2 * | 2/2005 | Chevallier | 365/201 |
| 2005/0243602 A1 * | 11/2005 | Umezawa | 365/185.11 |
| 2005/0286297 A1 * | 12/2005 | Roohparvar | 365/185.03 |
| 2007/0121376 A1 * | 5/2007 | Toda | 365/185.2 |

FOREIGN PATENT DOCUMENTS

| JP | 11-260069 | 9/1999 |
| JP | 2000-100178 | 4/2000 |
| JP | 2002150783 A | 5/2002 |
| KR | 10-1999-0077647 | 10/1999 |
| KR | 1020060017956 A | 2/2006 |
| KR | 10-2006-0060528 A | 6/2006 |
| KR | 1020060060528 A | 6/2006 |

\* cited by examiner

*Primary Examiner*—Son Dinh
*Assistant Examiner*—R Lance Reidlinger
(74) *Attorney, Agent, or Firm*—Volentine & Whitt, PLLC

(57) ABSTRACT

A flash memory device comprises a memory cell array including a plurality of NAND strings respectively connected to a plurality of bit lines, and further comprising a disturbed string coupled to a disturbed bit line. In a program operation of the flash memory device, a voltage level of the disturbed bit line is detected to detect program or pass voltage disturbance in the memory cell array.

38 Claims, 4 Drawing Sheets

FLASH MEMORY DEVICE EMPLOYING DISTURBANCE MONITORING SCHEME

BACKGROUND OF THE INVENTION

1. Field of the Invention

Embodiments of the invention relate generally to semiconductor memory devices. More particularly, embodiments of the invention relate to nonvolatile memory devices such as flash memory devices.

A claim of priority is made to Korean Patent Application No. 2006-81745 filed on Aug. 28, 2006, the disclosure of which is hereby incorporated by reference in its entirety.

2. Description of Related Art

Nonvolatile semiconductor memories can be found in a wide variety of consumer and industrial electronic devices such as computer systems, portable devices such as cellular phones and personal digital assistants, cameras, and so on. Nonvolatile semiconductor memories such as flash memory are extremely popular due to benefits such as their large storage capacity, low power consumption, resistance to physical shock, and low cost.

Flash memories are a type of electrically programmable and erasable read only memory (EEPROM), and therefore memory cells in flash memories may be referred to as "flash EEPROM cells", or simply flash memory cells. In general, a flash memory cell includes a cell transistor comprising a semiconductor substrate (or bulk) of a first conductivity type (e.g., P-type), source and drain regions of a second conductivity type (e.g., N-type), a floating gate formed above a channel region between the source and drain regions and adapted to store electrical charges, and a control gate formed over the floating gate. Because each of the cell transistors includes a floating gate, the cell transistors are commonly referred to as floating gate transistors.

A flash memory cell is typically programmed by applying voltages to the floating gate transistor in the flash memory cell to cause electrons to be trapped in the transistor's floating gate. Conversely, the flash memory cell is typically erased by applying voltages to the floating gate transistor to remove any charges trapped in the floating gate of the floating gate transistor. Without any charges trapped in the floating gate, the floating gate transistor generally has a negative threshold voltage. On the other hand, with charges stored in the floating gate, the threshold voltage of the floating gate transistor increases.

During a program operation, a selected memory cell is designated by a selected word line and a selected bit line. Programming voltages are respectively applied to the selected word line and the selected bit line. In general, the programming voltage for the selected word line is a relatively high voltage and the programming voltage for the selected bit line is a relatively low voltage such as ground. Memory cells that are not selected during the program operation, i.e., non-selected memory cells, are generally designated by non-selected bit lines. However, non-selected memory cells may actually be connected to selected word lines. Program-inhibit voltages are typically applied to the respective non-selected bit lines. For example, the non-selected bit lines may be connected to a power source voltage.

Unfortunately, the respective threshold voltages of non-selected memory cells may be increased when selected memory cells are programmed. One reason for this is that a selected word line connected to any non-selected memory cells may cause charges to be stored in the respective floating gates of the non-selected memory cells. In other words, where a relatively high programming voltage is applied to the selected word line, the high programming voltage is also applied to the control gates of non-selected memory cells connected to the selected word line. As a result, charges may be stored in the control gates of the non-selected memory cells. Such inadvertent programming of non-selected memory cells connected to a selected word line is referred to as "program voltage disturbance".

Sometimes, non-selected memory cells coupled to non-selected bit lines may even be inadvertently programmed by a pass voltage applied to non-selected word lines. This type of inadvertent programming of non-selected memory cells connected to non-selected word lines and a non-selected bit lines is referred to as "pass voltage disturbance".

Phenomena such as program voltage disturbance and pass voltage disturbance are described in a variety of references such as, for example, U.S. Pat. Nos. 5,715,194, 6,061,270, 6,661,707, and 7,031,190, the respective disclosures of which are hereby incorporated by reference in their entirety.

Figure 1:
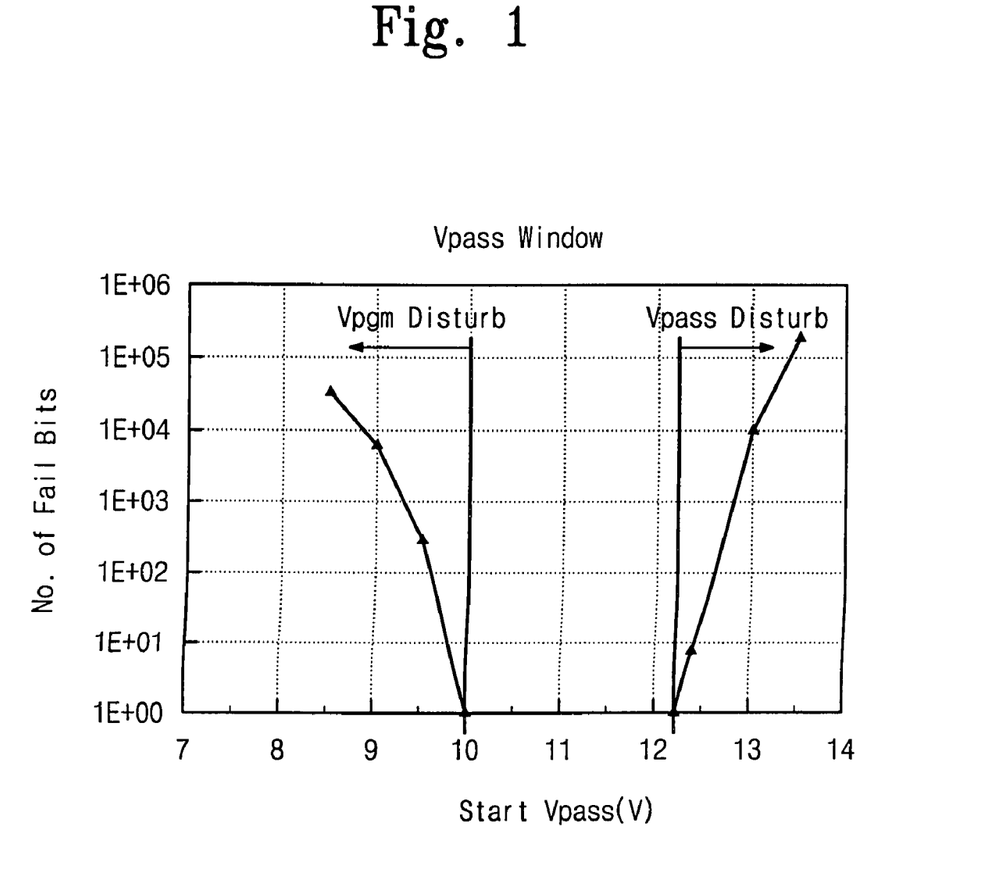
FIG. 1 is a graph illustrating a relationship between pass voltages of flash memory cells and program and pass voltage disturbance.

The effects of program voltage disturbance and pass voltage disturbance can be roughly illustrated by showing the total number of memory cells storing bad data in a memory device as a function of the level of a pass voltage applied to non-selected memory cells via a non-selected word line. For example, FIG. 1 is a graph illustrating a relationship between a number of inadvertently programmed bits (failed bits) in a flash memory device and a pass voltage Vpass applied to non-selected memory cells. As seen in FIG. 1, where pass voltage Vpass is less than 10V, program voltage disturbance tends to cause a significant number of failed cells, and where pass voltage Vpass is greater than 12V, pass voltage disturbance tends to cause a significant number of failed bits.

A range of pass voltage Vpass between 10V and 12V shows minimal numbers of failed cells in the graph of FIG. 1. This range of pass voltage Vpass where program and pass voltage disturbance are minimal is referred to as a "pass voltage window".

The above described program voltage and pass voltage disturbances occur during program operations. However, defective bits are generally not detected until a read operation is performed. As a result, where a first program operation is performed and then other program operations are performed on the same memory block as the first program operation without any intervening read operations, defectively programmed memory cells may effectively result in several program operations being wasted.

SUMMARY OF THE INVENTION

According to one embodiment of the invention, a flash memory device comprises a memory cell array. The memory cell array comprises a plurality of NAND strings respectively connected to a plurality of bit lines, and first and second disturbed strings respectively coupled to first and second disturbed bit lines. Each of the plurality of NAND strings comprises a plurality of memory cells and each of the first and second disturbed strings comprises a plurality of memory cells. The flash memory device further comprises a row selector adapted to drive word lines respectively connected to the plurality of memory cells within each of the plurality of NAND strings and within the first disturbed string, a page buffer circuit electrically connected to the bit lines and the first and second disturbed bit lines, a bias circuit configured to drive a common gate line connected to the memory cells in the second disturbed string, and a controller configured to control operation of the row selector, the page buffer circuit, and the bias circuit. During a program operation, the controller operates to control the page buffer circuit and the bias circuit such that one or more memory cells in the first disturbed string assume states indicative of program voltage disturbance and one or more memory cells in the second disturbed string assume states indicative of pass voltage disturbance.

According to another embodiment of the invention, a flash memory device comprises a memory cell array including a plurality of NAND strings respectively connected to a plurality of bit lines and a disturbed string connected to a disturbed bit line, wherein each of the plurality of NAND strings comprises a plurality of memory cells and the disturbed string comprises a plurality of memory cells. The flash memory device further comprises a row selector adapted to drive word lines respectively connected to the plurality of memory cells within each of the plurality of NAND strings and within the disturbed string, a page buffer circuit electrically connected to the bit lines and the disturbed bit line, and a controller configured to control operation of the row selector and the page buffer circuit. During a program operation, the controller controls the page buffer circuit such that one or more memory cells in the disturbed string assume states indicative of program voltage disturbance.

According to still another embodiment of the invention, a flash memory device comprises a memory cell array including a plurality of NAND strings respectively connected to a plurality of bit lines and a disturbed string connected to a disturbed bit line, wherein each of the plurality of NAND strings comprises a plurality of memory cells and the disturbed string comprises a plurality of memory cells. The flash memory device further comprises a row selector adapted to drive word lines respectively connected to the plurality of memory cells within each of the plurality of NAND strings and within the disturbed string, a page buffer circuit electrically connected to the bit lines and the disturbed bit line, a bias circuit configured to drive a common gate line connected to the memory cells in the second disturbed string, and a controller configured to control operation of the row selector and the page buffer circuit. During a program operation, the controller controls the page buffer circuit such that one or more memory cells in the disturbed string assume states indicative of program voltage disturbance.

According to still another embodiment of the invention, a method for operating a flash memory device is provided. The flash memory device comprises a memory cell array comprising a plurality of NAND strings respectively connected to a plurality of bit lines, and further comprises a first disturbed string coupled to a first disturbed bit line. The method comprises, during a program operation, detecting a voltage level of the first disturbed bit line to detect program voltage disturbance in the memory cell array.

According to still another embodiment of the invention, a method for operating a flash memory device is provided. The flash memory device comprises a memory cell array comprising a plurality of NAND strings respectively connected to a plurality of bit lines, and further comprising a disturbed string coupled to a disturbed bit line. The method comprises during a program operation, detecting a voltage level of the disturbed bit line to detect pass voltage disturbance in the memory cell array.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 2:
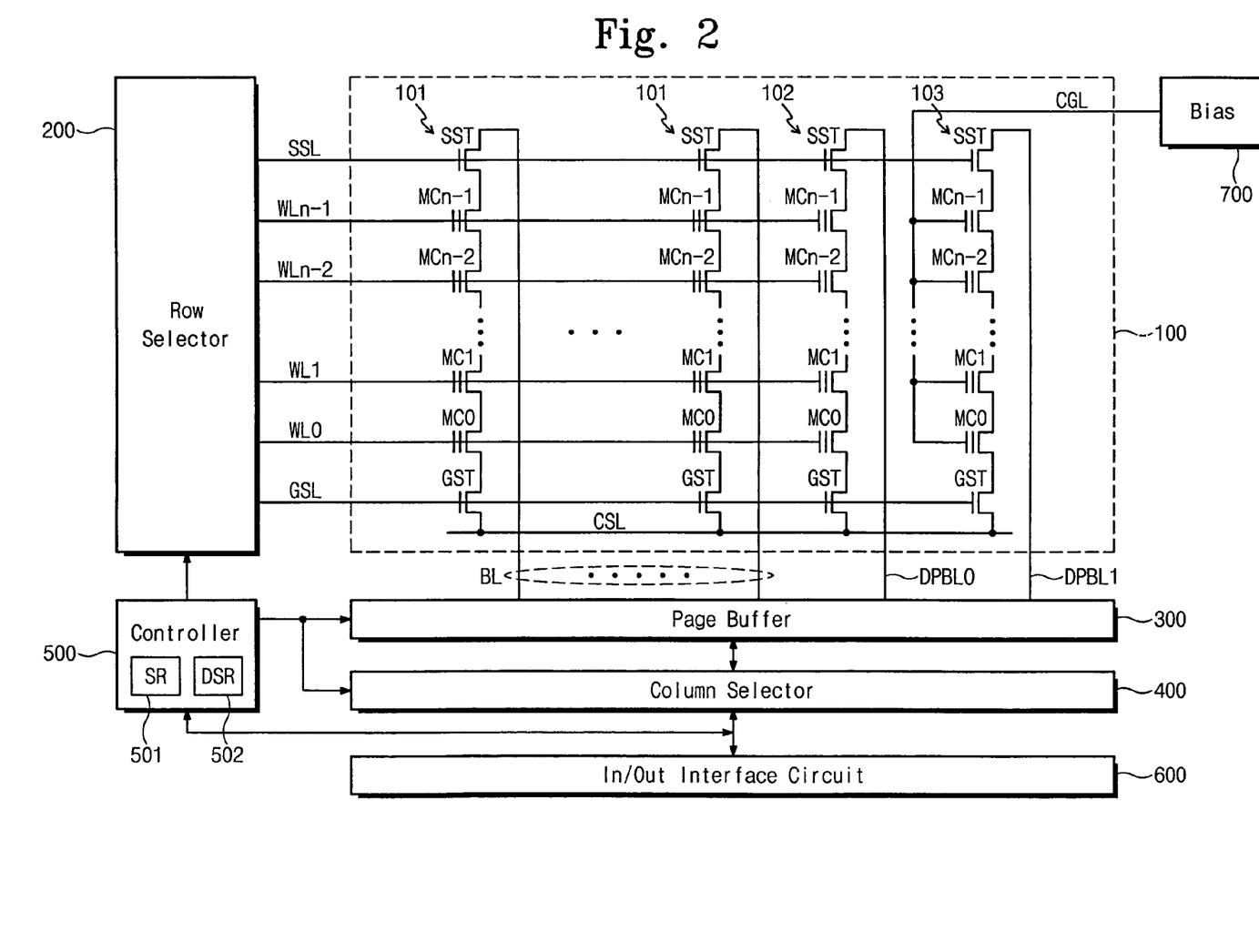
FIG. 2 is a block diagram illustrating a flash memory device in accordance with one embodiment of the present invention.

FIG. 2 is a block diagram illustrating a flash memory device in accordance with an exemplary embodiment of the present invention. Referring to FIG. 2, the flash memory device comprises a memory cell array 100, a row selector 200, a page buffer 300, a column selector 400, a controller 500, an input/output (IO) interface circuit 600, and a bias circuit 700.

Memory cell array 100 comprises a plurality of word lines WL0 through WLn-1, a plurality of bit lines BL, and a plurality of NAND strings 101 connected to bit lines BL and word lines WL0 through WLn-1. More particularly, each of NAND strings 101 comprises a string select transistor SS, a ground select transistor GST, and a plurality of nonvolatile memory cells MC0 through MCn-1 connected in series between a corresponding one of the plurality of bit lines BL and a common select line CSL. Memory cells MC0 through MCn-1 in NAND strings 101 have respective gates that are respectively connected to the plurality of word lines WL0 through WLn-1. Within each of NAND strings 101, the corresponding string select transistor SST is controlled by signals apparent on a string select line SSL and the corresponding ground select transistor GST is controlled by signals apparent on a ground select line GSL. The respective voltage levels of string select line SSL, ground select line GSL, and word lines WL0 through WLn-1 are controlled by row selector 200.

As illustrated in FIG. 2, memory cell array 100 further comprises a program disturbed string 102 connected to a first disturbed bit line DPBL0, and a pass-voltage disturbed string 103 connected to a second disturbed bit line DPBL1. Program disturbed string 102 monitors program disturbance and pass-voltage disturbed string 103 monitors pass-voltage disturbance.

Like NAND strings 101, in program disturbed string 102, string and ground select transistors SST and GST and memory cells MC0 through MCn-1 are controlled by string and ground select lines SSL and GSL and word lines WL0 through WLn-1, respectively. Similarly, in pass-voltage disturbed string 103, string and ground select transistors SST and GST are controlled by string and ground select lines SSL and GSL, respectively. However, in pass-voltage disturbed string 103, memory cells MC0 through MCn-1 are coupled to a common gate line CGL rather than to word lines WL0 through WLn-1.

Program and pass-voltage disturbed strings 102 and 103 are provided to detect program voltage disturbance and pass voltage disturbance, respectively. The program voltage disturbance can be detected by determining whether memory cells MC0 through MCn-1 in program voltage disturbed string 102 are unintentionally programmed and the pass voltage disturbance can be detected by determining whether memory cells MC0 through MCn-1 in pass voltage disturbed string 103 are unintentionally programmed.

Controller 500 controls row selector 200, page buffer circuit 300, and column selector 400. Page buffer circuit 300 acts as a sense amplifier circuit during read operations and as a write driver circuit during program operations. Although not shown in FIG. 2, page buffer circuit 300 typically includes page buffers corresponding to each of bit lines BL and first and second disturbed bit lines DPBL0, and DPBL1. Each of bit lines BL and first and second disturbed bit lines DPBL0 and DPBL1 is typically formed of a pair of bit lines, and therefore each page buffer in page buffer circuit 300 is generally connected to a bit line pair.

Page buffer circuit 300 is typically configured to drive first and second disturbed bit lines DPBL0 and DPBL1 to the power source voltage and ground, respectively under the control of controller 500 during program operations. On the other hand, bit lines BL are generally driven with the power source voltage or ground based on data loaded in page buffer circuit 300. Column selector 400 is typically configured to select the page buffers under the control of controller 500. Controller 500 is configured to regulate the overall operation of the flash memory device. IO interface circuit 600 is configured to interface with an external system such as a memory controller or a host.

Bias circuit 700 is configured to drive common gate line CGL electrically connected to pass-voltage disturbed string 103. Bias circuit 700 is controlled by controller 500. During the program operation, bias circuit 700 drives common gate line CGL with a pass voltage Vpass. In other words, during the program operation, memory cells included in pass-voltage disturbed string 103 are simultaneously driven with pass voltage Vpass. During program operations, disturbed bit line DPBL1 coupled to pass voltage disturbed string 103 is driven to ground through page buffer circuit 300. During read operations such as a normal read operation or a verity-read operation, bias circuit 700 drives common gate line CGL to ground. Where at least one of the memory cells included in pass-voltage disturbed string 103 is unintentionally programmed, a voltage of disturbed bit line DPBL1 increases. Accordingly, the increase in the voltage of disturbed bit line DPBL1, indicates pass voltage disturbance.

Controller 500 comprises a state register (SR) 501 and a disturbed state register (DSR) 502. State register 501 stores program state values for NAND strings 101 and disturbed state register 502 stores state values for disturbed strings 102 and 103 as will be described later.

During program operations of memory cell array 100, program and pass-voltage disturbed strings 102 and 103 are placed in conditions to detect program and pass voltage disturbances. After a program operation is performed, a verify-read operation is performed on disturbed strings 102 and 103 to determine whether the program operation caused any program or pass voltage disturbance. By determining whether program or pass voltage disturbance has occurred, the reliability of memory cell array 100 can be increased.

Figure 3:
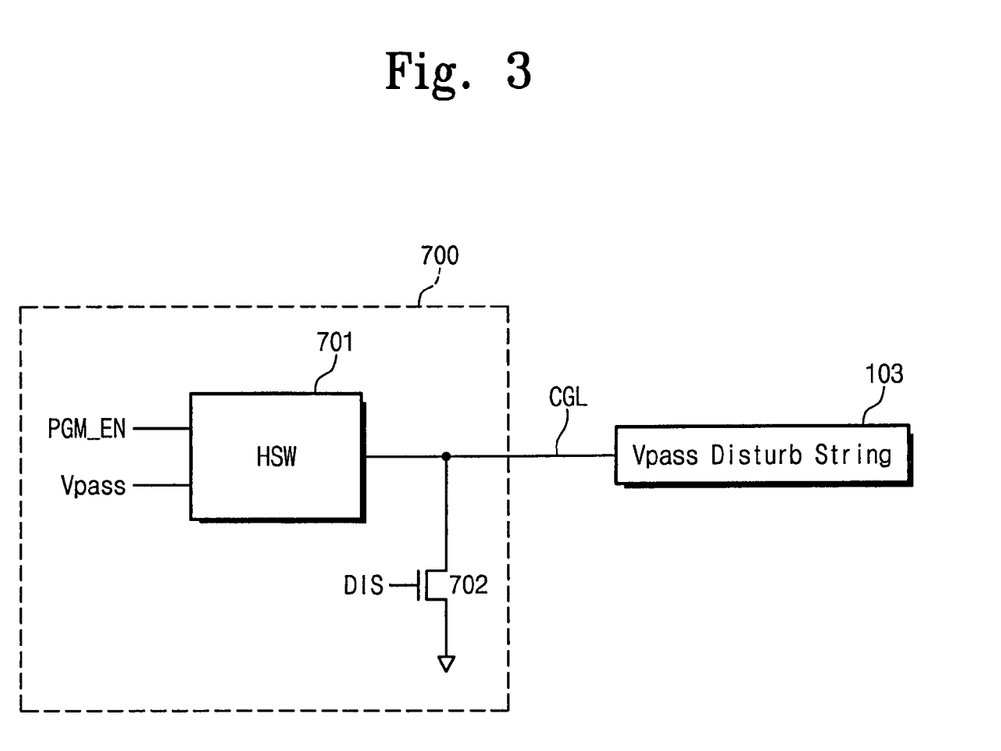
FIG. 3 is a block diagram illustrating an embodiment of a bias circuit shown in FIG. 2.

FIG. 3 is a block diagram illustrating an implementation of bias circuit 700 shown in FIG. 2. Referring to FIG. 3, bias circuit 700 is electrically connected to pass-voltage disturbed string 103 through common gate line CGL. Bias circuit 700 comprises a high voltage switch 701 and an NMOS transistor 702 connected between common gate line CGL and ground. High voltage switch 701 transfers pass voltage Vpass to common gate line CGL in response to a control signal PGM_EN. Control signal PGM_EN, which is provided by controller 500, is active during the program operation. Where control signal PGM_EN is inactive, common gate line CGL is maintained at ground. NMOS transistor 702 is connected between common gate line CGL and ground in response to a control signal DIS. Control signal DIS is supplied by controller 500 to discharge common gate line CGL.

Figure 4:
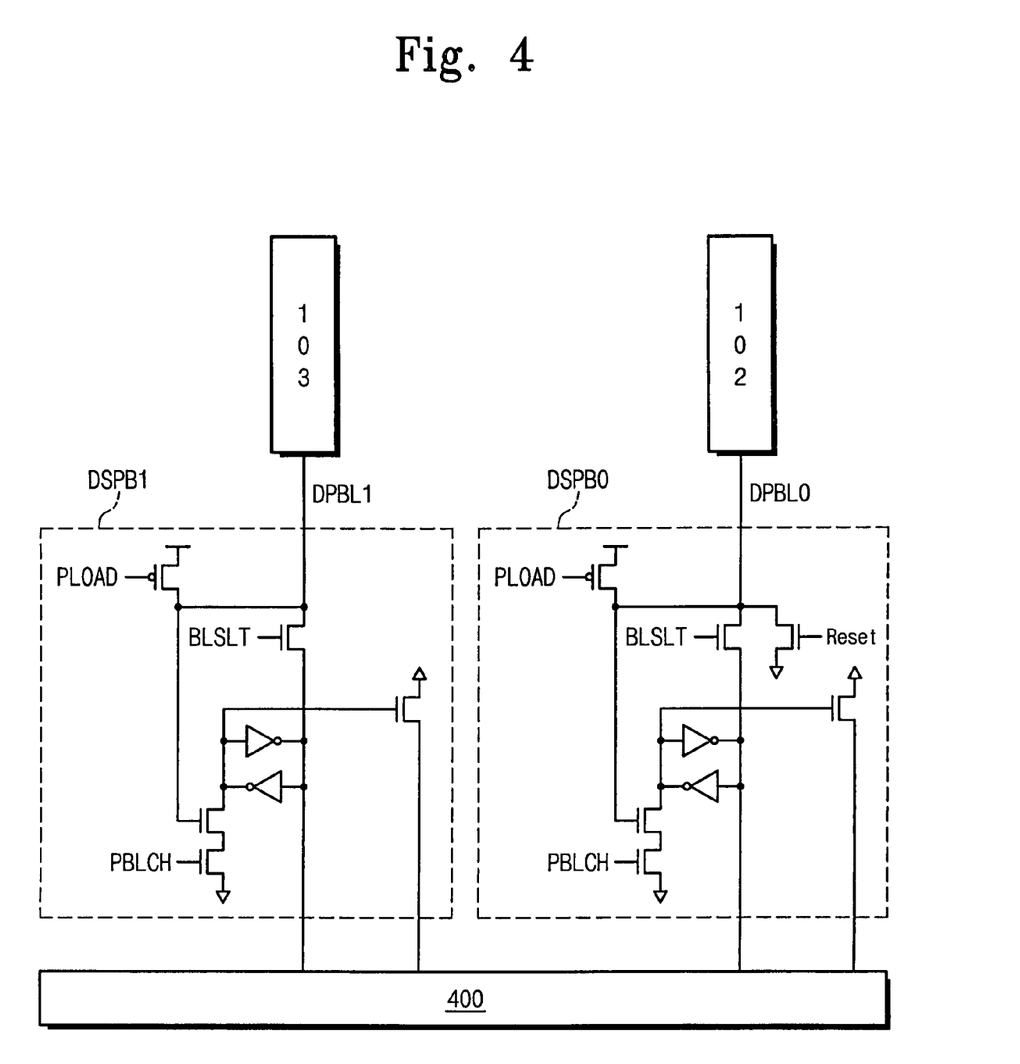
FIG. 4 is a circuit diagram partially illustrating an embodiment of a page buffer circuit illustrated in FIG. 2 in correspondence each with disturbed bit lines.

FIG. 4 is a circuit diagram partially illustrating page buffer circuit 300 of FIG. 2. Referring to FIG. 4, page buffer circuit 300 comprises page buffers DSPB0 and DSPB1 electrically coupled to program and pass-voltage disturbed strings 102 and 103, respectively. Page buffers DSPB0 and DSPB1 are controlled by controller 500 shown in FIG. 2. For instance, during program operations, controller 500 causes page buffers DSPB0 and DSPB1 to drive disturbed bit lines DPBL0 and DPBL1 with the power source voltage and ground, respectively. Those skilled in the art will recognize that page buffers DSPB0 and DSPB1 are can be modified or implemented in a variety of ways. During read operations such as verify-read operations and normal read operations, data sensed by page buffers DSPB0 and DSPB1 is transferred to controller 500 through column selector 400.

A program operation of the flash memory device shown in FIG. 2 will now be described with reference to FIGS. 2 through 4. In general, the flash memory device performs program operations using either a self-boosting or a local self-boosting scheme. Various examples of self-boosting and local self-boosting schemes are disclosed, in U.S. Pat. Nos. 5,677,873, 5,715,194, 5,991,202, and 6,061,270, the respective disclosures of which are incorporated by reference.

For purposes of the program operation, data to be programmed is loaded into page buffer circuit 300 through interface circuit 600 and column selector 400 under the control of controller 500. Controller 500 controls page buffer circuit 300 to drive disturbed bit lines DPBL0 and DPBL1 with the power source voltage and ground, respectively. A selected word line (e.g., WL0) is driven into with the program voltage and non-selected word lines (e.g., WL1 through WLn-1) are driven with the pass voltage. Under these bias conditions, memory cell MC0 in program disturbed string 102 is supplied with the program voltage while other memory cells MC1 through MCn-1 in program disturbed string 102 are supplied with the pass voltage. At the same time, the memory cells of pass-voltage disturbed string 103 are supplied with the pass voltage from bias circuit 700 by way of common gate line CGL.

With these bias conditions, the memory cells of program disturbed string 102 are provided with approximately the same program voltage disturbance conditions as NAND strings 101, and the memory cells of pass-voltage disturbed string 103 are provided with approximately the same pass voltage disturbance conditions as NAND strings 101.

After performing the program operation for a predetermined time, a corresponding verify-read operation is carried out to determine whether the program operation was successfully executed. Procedures for performing verify-read operations are well known in the art, and hence a detailed description thereof will not be provided here. Based on a result of the verify-read operation, the program operation may be repeated for a predetermined number of program loops. After successfully completing the program operation in the predetermined number of program loops, controller 500 stores one or more state values in state register 501, the state values indicating successful execution of the program operation. Where the program operation has not been successfully executed, controller 500 stores one or more state values in state register 501, the state values indicating unsuccessful execution of the program operation. The state values stored in state register 501 may be output from the flash memory device in a read operation.

In general, the verify-read operation of disturbed strings 102 and 103 can be carried out after completion of a program operation of NAND strings 101 or in a separate, additional read operation. An example of the verify-read operation of disturbed strings 102 and 103 is described below.

In a first scenario, It is assumed that the verity-read operation for program and pass-voltage disturbed strings 102 and 103 is carried out subsequent to the program operation of NAND strings 101. According to this assumption, after completing the program operation for NAND strings 101, state values corresponding to results of the program operation are stored in state register 501 of controller 500. Next, controller 500 initiates the verify-read operation for disturbed strings 102 and 103. In conducting the verify-read operation for the disturbed strings 102 and 103, first, controller 500 controls row selector 200 to drive the selected word line (e.g., WL0) to ground and to drive the remaining word lines (WL1~WLn-1) with a read voltage. At the same time, controller 500 controls bias circuit 700 to drive common gate line CGL with ground. Under these bias conditions, page buffer circuit 300 detects voltages of disturbed bit lines DPBL0 and DPBL1. Where the voltages of disturbed bit lines DPBL0 and DPBL1 are at relatively low levels, it is determined that no program or pass voltage disturbance has occurred. In contrast, where the voltages of disturbed bit lines DPBL0 or DPBL1 are both at relatively high levels, it is determined that program and/or pass voltage disturbance has occurred. Data sensed by page buffer circuit 300 in the verify-read operation of pass-voltage disturbed strings 102 and 103 is stored in disturbed state register 502 of controller 500 by way of column selector 400.

State values stored in disturbed state register 502 may be provided to an external system together with the state values stored in state register 501 during a state read operation of state register 501.

In a second scenario, it is assumed that the verify-read operation for program and pass-voltage disturbed strings 102 and 103 is carried out by means of the additional disturbed read operation. Under this assumption, a disturbed read command is provided to controller 500 of the flash memory device from an external system (e.g., a memory controller or host) for the verify-read operation to the program and pass-voltage disturbed strings 102 and 103. Once the disturbed read command is transferred to controller 500, the verify-read operation for program and pass-voltage disturbed strings 102 and 103 is carried out in the same manner as described above under the control of controller 500. However, in the second scenario, state values stored in state register 502 of controller 500 are provided to the external system during the disturbed read operation.

As described above, embodiments of the invention improve the reliability of flash memory devices by detecting program and pass voltage disturbances during program operations.

The foregoing exemplary embodiments are teaching examples. Those of ordinary skill in the art will understand that various changes in form and details may be made to the exemplary embodiments without departing from the scope of the invention as defined by the following claims.

What is claimed:

1. A flash memory device, comprising:
a memory cell array comprising a plurality of NAND strings respectively connected to a plurality of bit lines, and further comprising first and second disturbed strings respectively coupled to first and second disturbed bit lines, wherein each of the plurality of NAND strings comprises a plurality of memory cells and each of the first and second disturbed strings comprises a plurality of memory cells;
a row selector adapted to drive word lines respectively connected to the plurality of memory cells within each of the plurality of NAND strings and within the first disturbed string;
a page buffer circuit electrically connected to the bit lines and the first and second disturbed bit lines;
a bias circuit configured to drive a common gate line connected to the memory cells in the second disturbed string; and
a controller configured to control operation of the row selector, the page buffer circuit, and the bias circuit;
wherein during a program operation, the controller operates to control the page buffer circuit and the bias circuit such that one or more memory cells in the first disturbed string assume states indicative of program voltage disturbance and one or more memory cells in the second disturbed string assume states indicative of pass voltage disturbance.

2. The flash memory device of claim 1, wherein during the program operation, the controller operates to control the page buffer circuit and the bias circuit to drive the first and second disturbed bit lines with a power source voltage and a ground voltage, respectively, and to drive the common gate line with a pass voltage.

3. The flash memory device of claim 1, wherein a verify-read operation for the first and second disturbed strings is performed subsequent to the program operation for the NAND strings.

4. The flash memory device of claim 3, wherein during the verify-read operation, the controller controls the row selector and the bias circuit to drive the word lines and the common gate line with a ground voltage.

5. The flash memory device of claim 4, wherein during the verify-read operation, the page buffer circuit detects voltages apparent on the first and second disturbed bit lines and stores results of the detection in a disturbed state register within the controller.

6. The flash memory device of claim 5, wherein the controller outputs the results of the detection stored in the disturbed state register to an external system, together with results of the program operation, in response to a state read command.

7. The flash memory device of claim 5, wherein the disturbed state register outputs the results of the detection to an external system in response to a disturbed state read command.

8. The flash memory device of claim 1, wherein a verify-read operation for the first and second disturbed strings is carried out in response to a disturbed verify-read command provided from an external source after the program operation.

9. The flash memory device of claim 8, wherein during the verify-read operation, the controller controls the row selector and the bias circuit to drive the word lines and the common gate line with a ground voltage.

10. The flash memory device of claim 9, wherein during the verify-read operation, the page buffer circuit detects voltages apparent on the first and second disturbed bit lines and stores results of the detection in a disturbed state register in the controller.

11. The flash memory device of claim 10, wherein the controller outputs the results of the detection stored in the disturbed state register to an external system in response to a state read command.

12. The flash memory device of claim 1, wherein each of the NAND strings and the first and second disturbed strings comprises a string select transistor and a ground select transistor respectively connected to a string select line and a ground select line driven by the row selector.

13. A flash memory device comprising:
a memory cell array including a plurality of NAND strings respectively connected to a plurality of bit lines and a disturbed string connected to a disturbed bit line, wherein each of the plurality of NAND strings comprises a plurality of memory cells and the disturbed string comprises a plurality of memory cells;
a row selector adapted to drive word lines respectively connected to the plurality of memory cells within each of the plurality of NAND strings and within the disturbed string;
a page buffer circuit electrically connected to the bit lines and the disturbed bit line; and
a controller configured to control operation of the row selector and the page buffer circuit;
wherein during every program operation of the plurality of NAND strings, the controller controls the page buffer circuit to drive the disturbed bit line with a power source voltage.

14. The flash memory device of claim 13, wherein a verify-read operation for the disturbed string is performed subsequent to the program operation.

15. The flash memory device of claim 14, wherein during the verify-read operation, the controller controls the row selector to drive the word lines with a ground voltage.

16. The flash memory device of claim 15, wherein during the verify-read operation, the page buffer circuit detects a voltage apparent on the disturbed bit line and stores a result of the detection in a disturbed state register within the controller.

17. The flash memory device of claim 16, wherein the controller outputs the result of the detection from the disturbed state register to an external system, together with results of the program operation, in response to a state read command.

18. The flash memory device of claim 16, wherein the controller outputs the result of the detection from the disturbed state register to an external system in response to a state read command.

19. The flash memory device of claim 13, wherein a verify-read operation for the disturbed string is carried out in response to a disturbed verify-read command provided from an external source after the program operation.

20. The flash memory device of claim 19, wherein during the verify-read operation, the controller controls the row selector to drive the word lines with a ground voltage.

21. The flash memory device of claim 20, wherein during the verify-read operation, the page buffer circuit detects a voltage apparent on the disturbed bit line and stores a result of the detection in a disturbed state register within the controller.

22. The flash memory device of claim 21, wherein the controller outputs the result of the detection stored in the disturbed state register to an external system in response to a state read command.

23. The flash memory device of claim 13, wherein each of the NAND strings and the disturbed string comprises a string select transistor and a ground select transistor respectively connected to a string select line and a ground select line driven by the row selector.

24. A flash memory device, comprising:
a memory cell array including a plurality of NAND strings respectively connected to a plurality of bit lines and a disturbed string connected to a disturbed bit line, wherein each of the plurality of NAND strings comprises a plurality of memory cells and the disturbed string comprises a plurality of memory cells;
a row selector adapted to drive word lines respectively connected to the plurality of memory cells within each of the plurality of NAND strings;
a page buffer circuit electrically connected to the bit lines and the disturbed bit line;
a bias circuit configured to drive a common gate line connected to the memory cells in the disturbed string; and
a controller configured to control operation of the row selector and the page buffer circuit;
wherein during a program operation, the controller controls the page buffer circuit and the bias circuit such that one or more memory cells in the disturbed string assume states indicative of pass voltage disturbance.

25. The flash memory device of claim 24, wherein during the program operation, the controller operates to control the page buffer circuit and the bias circuit to drive the disturbed bit line with a ground voltage and to drive the common gate line with a pass voltage.

26. The flash memory device of claim 24, wherein a verify-read operation for the disturbed string is performed subsequent to the program operation for the NAND strings.

27. The flash memory device of claim 26, wherein during the verify-read operation, the controller controls the bias circuit to drive the common gate line with a ground voltage.

28. The flash memory device of claim 27, wherein during the verify-read operation, the page buffer circuit detects a voltage apparent on the disturbed bit line and stores a result of the detection in a disturbed state register within the controller.

29. The flash memory device of claim 28, wherein the controller outputs the result of the detection stored in the disturbed state register to an external system, together with results of the program operation, in response to a state read command.

30. The flash memory device of claim 28, wherein the disturbed state register outputs the result of the detection to an external system in response to a disturbed state read command.

31. The flash memory device of claim 24, wherein a verify-read operation for the disturbed string is carried out in response to a disturbed verify-read command provided from an external source after the program operation.

32. The flash memory device of claim 31, wherein during the verify-read operation, the controller controls the row selector and the bias circuit to drive the word lines and the common gate line with a ground voltage.

33. The flash memory device of claim 32, wherein during the verify-read operation, the page buffer circuit detects a voltage apparent on the disturbed bit line and stores a result of the detection in a disturbed state register in the controller.

34. The flash memory device of claim 33, wherein the controller outputs the results of the detection stored in the disturbed state register to an external system in response to a state read command.

35. The flash memory device of claim 24, wherein each of the NAND strings and the disturbed string comprises a string select transistor and a ground select transistor respectively connected to a string select line and a ground select line driven by the row selector.

36. A method for operating a flash memory device comprising a memory cell array comprising a plurality of NAND strings respectively connected to a plurality of bit lines, and further comprising a first disturbed string coupled to a first disturbed bit line, the method comprising:

during every program operation of the plurality of NAND strings, driving the disturbed bit line with a power source voltage; and, detecting a voltage level of the first disturbed bit line to detect program voltage disturbance in the memory cell array.

37. The method of claim 36, wherein the memory cell array further comprises a second disturbed string coupled to a second disturbed bit line, and the method further comprises:

detecting a voltage level of the second disturbed bit line to detect pass voltage disturbance in the memory cell array.

38. A method for operating a flash memory device comprising a memory cell array comprising a plurality of NAND strings respectively connected to a plurality of bit lines, and further comprising a disturbed string comprising a plurality of memory cells, wherein the disturbed string is coupled to a disturbed bit line, the method comprising:

driving a common gate line connected to gates of the memory cells in the disturbed string using a bias circuit; and, detecting a voltage level of the disturbed bit line to detect pass voltage disturbance in the memory cell array.

* * * * *